US005753927A

United States Patent [19]

Schneider

[11] Patent Number: 5,753,927
[45] Date of Patent: *May 19, 1998

[54] MAJORITY VOTED OPTICAL POWER SWITCH

[75] Inventor: John R. Schneider, Brea, Calif.

[73] Assignee: Boeing North American, Inc., Seal Beach, Calif.

[*] Notice: The term of this patent shall not extend beyond the expiration date of Pat. No. 5,498,912.

[21] Appl. No.: 537,317

[22] Filed: Sep. 29, 1995

[51] Int. Cl.⁶ ............................................. H03K 19/003
[52] U.S. Cl. ........................... 250/551; 250/214 SW; 326/11; 307/115
[58] Field of Search ........................... 250/551, 214 LS, 250/214 SW; 307/115; 326/11; 371/26

[56] References Cited

U.S. PATENT DOCUMENTS

| 4,697,093 | 9/1987 | Sutherland et al. | 307/38 |
| 4,726,026 | 2/1988 | Hilford et al. | 371/36 |
| 4,799,140 | 1/1989 | Dietz et al. | 364/140 |
| 4,868,826 | 9/1989 | Smith et al. | 371/9.1 |
| 5,280,202 | 1/1994 | Chan et al. | 307/465 |
| 5,498,912 | 3/1996 | Templeman et al. | 326/11 |

*Primary Examiner*—Edward P. Westin
*Assistant Examiner*—Kevin Pyo
*Attorney, Agent, or Firm*—Lawrence N. Ginsberg; Charles T. Silberberg

[57] ABSTRACT

A majority voted multiple-fault tolerant power switch for delivering power from a power source to an intended load. The power switch includes an optical voter, which has a photo conductor array for receiving optical voter input commands from a control system and for selecting a voter output from the majority of the input commands. An electronic power switch receives power input from the power source. The power switch is controlled by the voter output. An output from the power switch is connected to the intended load. A voltage source supplies the voltage to the optical voter. An operational amplifier circuit is connected to the electronic power switch to limit over current and inhibit reverse current in the electronic power switch.

8 Claims, 7 Drawing Sheets

MAJORITY VOTED OPTICAL POWER SWITCH

BACKGROUND OF THE INVENTION

1. Field of the Invention

The present invention relates to power switches and more particularly to a majority voted multiple fault tolerant optical power switch.

2. Description of the Related Art

Presently available fault tolerant or redundant effector designs utilize moderate power consumption, and generally need a complex power switching scheme. Generally, such conventional systems require cross-strapping and/or multiple lines to maintain the fault tolerance of the system. Fault tolerance of typical power switching is often difficult to accomplish and requires a large number of conventional components to implement properly.

U.S. Pat. No. 4,697,093, issued to Sutherland et al., discloses a power interface circuit, which periodically receives test pulses to test the operation and connections thereof. Voltage and current sensors detect the result of the testing and may be used for zero-crossing detection when AC power devices are controlled by the power interface circuit.

U.S. Pat. No. 4,799,140, issued to Dietz et al., discloses an electronic sequencing system comprised of two groups of three identically operating sequencers and circuitry that combines the outputs of these sequencers so that desired sequencing of devices is obtained. Each sequencer is comprised of a micro-processor, memory and peripheral circuits. The individual sequencer outputs are combined such that at least one of the corresponding system outputs would activate the device to be sequenced if at least three corresponding individual sequencer outputs signal that the device should be activated.

U.S. Pat. No. 4,868,826, issued to Smith et al., discloses circuit modules for providing digital or analog outputs from computational devices in such a manner that the components of the output circuit modules are tolerant of malfunctions in one or more of the components. In the digital output embodiment of the invention, output signals are independently derived using two voting circuits and are then applied to two switches connected in series to provide a fail-safe condition for most types of failure of the switches or the voting circuits.

U.S. Pat. No. 5,282,202, issued to Chan et al., discloses a field programmable gate array, including a programmable routing network, a programmable configuration network integrated with the programmable routing network, and a logic cell integrated with the programmable configuration network.

OBJECTS AND SUMMARY OF THE INVENTION

A principal object of the present invention is to provide majority voting for power switching which also produces multiple-fault tolerance.

Another object of the present invention is to provide test and checkout capability.

Still another object of the present invention is to provide low power consumption.

Yet another object of the present invention is to provide a simple isolated interface between the vote and the self test features.

Still another object of the present invention is the use of wire fuses to prevent damage to external devices.

Still another object is to provide a power switch which may be easily manufactured for relatively high or relatively low currents.

Still another object of the present invention is to monitor the over current status of the intended load.

Still another object is to provide a simple isolated interface between the system and voter and system and test.

These and other objects are achieved by the present invention which is a majority voted multiple-fault tolerant power switch for delivering power from a power source to an intended load. The power switch includes an optical voter, which has a photo conductor array for receiving optical voter input commands from a control system and for selecting a voter output from the majority of the input commands. An electronic power switch receives power input from the power source. The power switch is controlled by the voter output. An output from the power switch is connected to the intended load. A voltage source supplies the voltage to the optical voter. An operational amplifier circuit is connected to the electronic power switch to limit over current and inhibit reverse current in the electronic power switch.

A number of majority voted optical power switches may be interconnected in a series/parallel arrangement to provide a multiple fault tolerant power voter assembly for delivering power from a number of power sources to an intended load.

The present invention provides an easy, simple connection to an optical command optic network.

The majority voted optical power switch of the present invention can be manufactured relatively inexpensively and in mass quantities. It can be manufacturing as an integrated circuit and can be mass produced in a single process. Identical integrated circuits can be inter-connected at will to achieve various fault tolerance requirements.

The power switches are individually testable. They have low power consumption.

Other objects, advantages and novel features of the present invention will become apparent from the following detailed description of the invention when considered in conjunction with the accompanying drawings.

BRIEF DESCRIPTION OF THE DRAWINGS

The same elements or parts throughout the figures are designated by the same reference characters.

DETAILED DESCRIPTION OF THE PREFERRED EMBODIMENT

Figure 1:
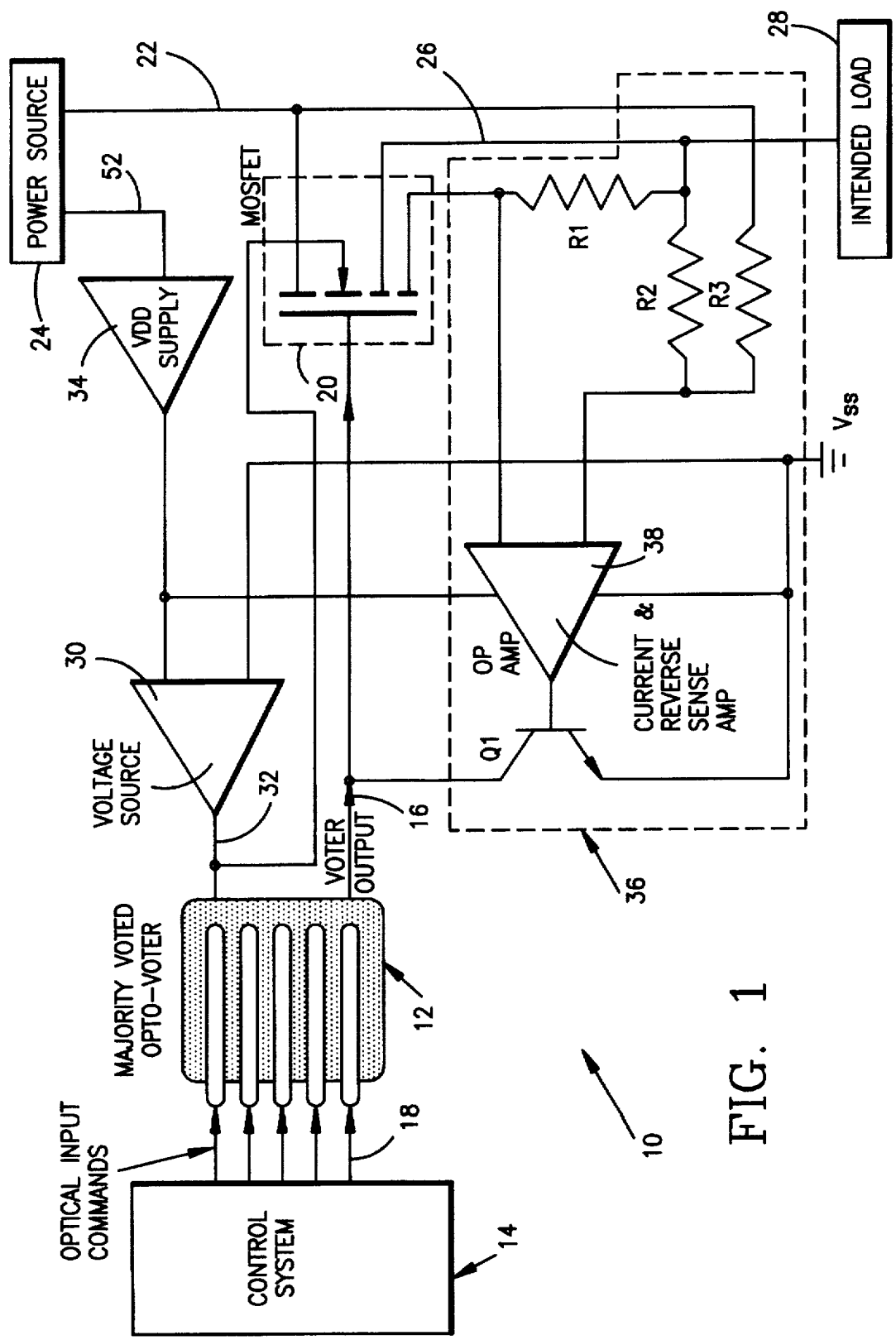
FIG. 1 is a schematic block diagram of a majority voted optical power switch, in accordance with the principles of the present invention.

Referring now to the drawings and the characters of reference marked thereon, FIG. 1 illustrates a preferred embodiment of the majority voted optical power switch of the present invention, designated generally as 10. Optical power switch 10 includes an optical voter, designated generally as 12. The optical voter 12 includes a photo-conductor array, discussed in detail below, for receiving optical voter input commands from a control system 14 and for selecting a voter output 16 from the majority of the input commands 18 from the control system 14. Power switching means 20 is controlled by the voter output 16. It receives power input 22 from a power source 24. The power switching means 20 preferably comprises a MOSFET, most preferably a current sensing MOSFET. An example current sensing MOSFET is International Rectifier IRCCZ44. Other power switching means may be utilized instead of MOSFETs. For example, bi-polar power Darlington, insulated gate-by-junction transistors may be utilized. It is noted that the advantage of using a current sensing MOSFET is that it has an additional electrode to help measure current flow. An output 26 from the MOSFET 20 is connected to the intended load 28.

The intended load 28 may be another connected majority voted optical power switch (the interconnection therewith discussed below in detail), or the ultimate load device. Such load devices may include, for example, motors, relays, lights, other electrical equipment or other electrical devices in which control of the current is required.

The power source 24 may be, for example, an output of another majority voted optical power switch or an external power source. Such external power sources, may be, for example, batteries, fuel cells, generators, and other power converters, etc.

A voltage source 30 supplies a voltage to the optical voter 12. The output 32 of the voltage source 30 is conducted through the photo conductor array to the voter output 16 with sufficient voltage to turn on the MOSFET 20. Voltage source 30 is preferably a charge pump circuit so that it can be integrated on an IC chip.

A Vdd supply 34 may be used to provide the proper voltages for the circuits on the resultant IC chip.

An operational amplifier circuit, shown within broken lines 36 is connected to the MOSFET 20 to limit overcurrent and inhibit reverse current in the MOSFET 20. The operational amplifier circuit 36 includes an operational amplifier 38; a resistor network R1, R2, R3; and, output buffer transistor Q1. When Q1 turns on, the voter output 16 is shunted to ground, Vss, causing the MOSFET 20 to turn off or open circuit. Q1 may be turned on by a two conditions: A reverse potential across the MOSFET switch or overcurrent through the MOSFET 20 causing a sufficient voltage drop across R1 to also turn on Q1. (Although not shown in the Figure, depending on the application, additional components may be required, such as resistors, diodes, and capacitors.)

Figure 2:
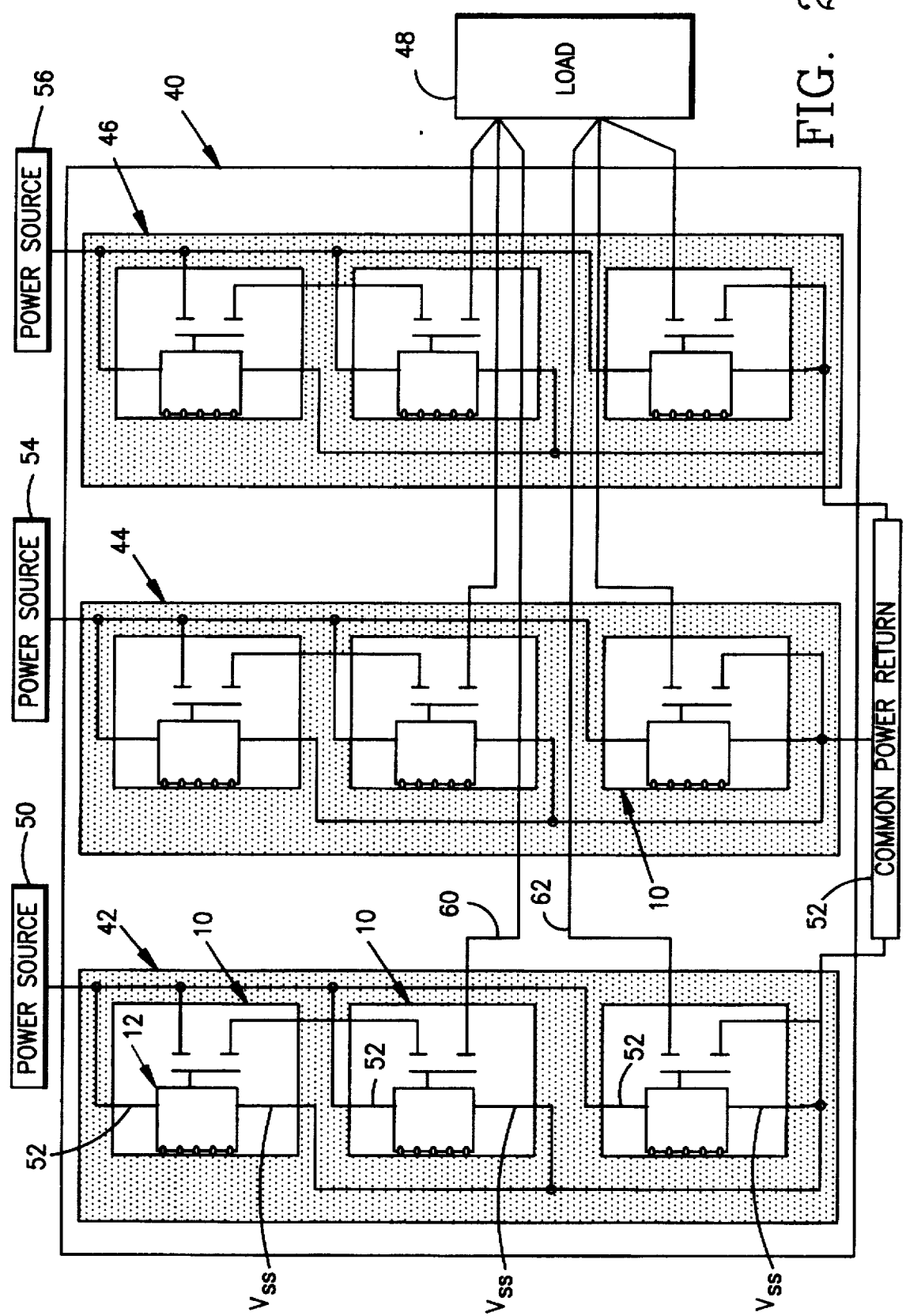
FIG. 2 illustrates a multiple fault tolerant power voter assembly formed of a number of majority voted optical power switches.

Referring now to FIG. 2, a number of majority voted optical power switches 10 are shown interconnected in series/parallel to provide a multiple fault tolerant power voter assembly, designated generally as 40. Assembly 40 includes three serially connected switch string subassemblies 42, 44, and 46. Each switch string subassembly is identical and comprises three majority voted optical power switches 10. It is understood that although three switch string subassemblies are shown, each comprising three switches 10, this showing is for the purpose of example. The number of subassemblies and switches in each subassembly depends on the specific application. However, there should be an odd number of switches 10 to provide a majority vote. For example, if there are five switches, i.e. channels, two-fault tolerance of input commands is provided. Generally, the number of switch string subassemblies equals the number of power sources 24. Such a serial connection provides fault tolerance against one or more "stuck-on" switches. Power flow through a subassembly, for example, 42, is serially through the MOSFETs and the load 48, completing the circuit from a power source 50 to the common power return 52. It is noted that the common power return 52 may be the Vss. The internal supply connection 52 is connected in parallel to the power source 50. This powers each of the three switches 10 in the subassembly 42. Power sources 54 and 56 may be, in actuality, the same as power source 50. In other words, a common power source may be utilized.

Assembly 40 allows separate redundant power sources to be switched into a single load without interaction and while retaining power redundancy.

Figure 3:
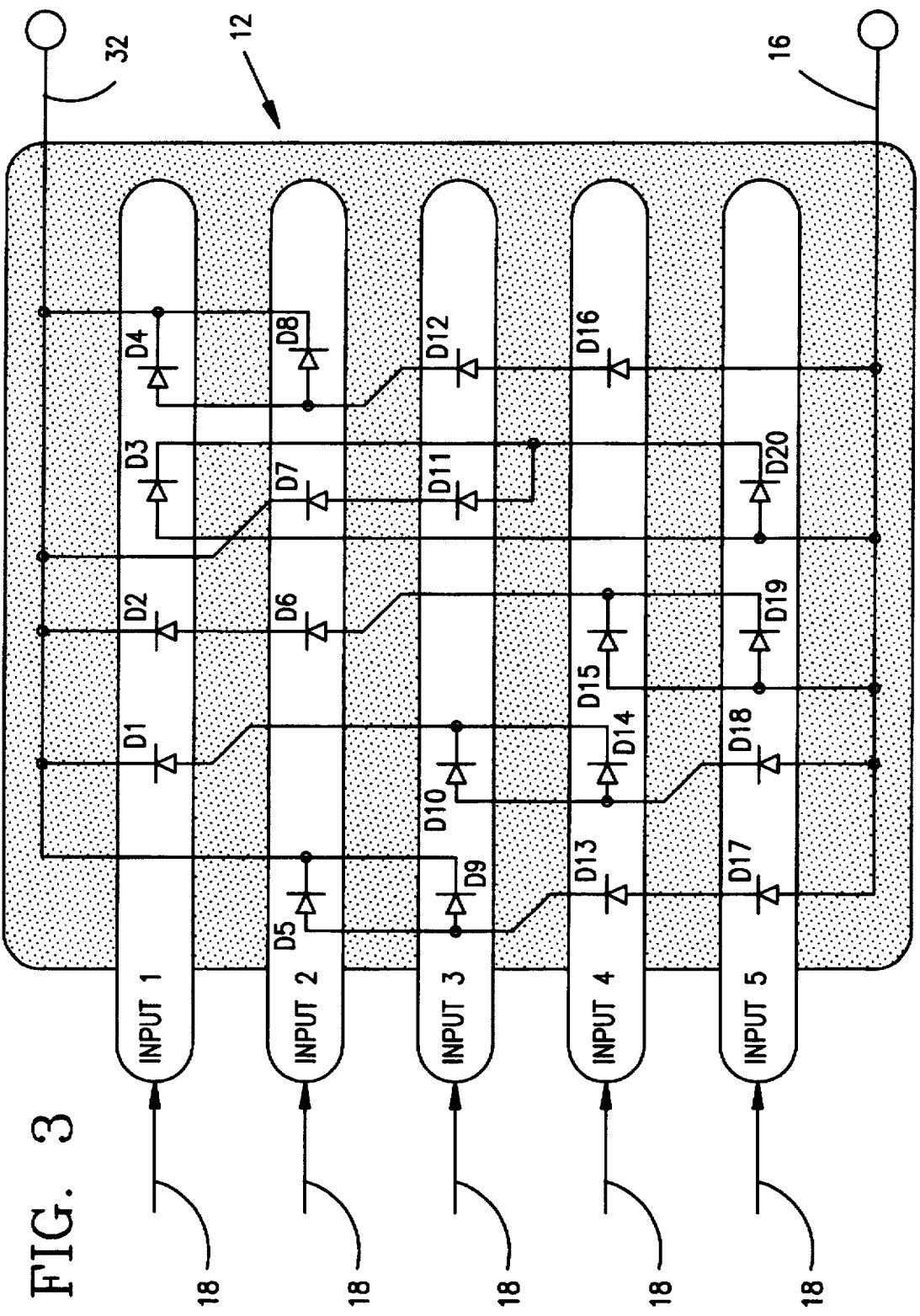
FIG. 3 is a detailed schematic diagram of an optical voter used by a majority voted optical power switch.

Referring now to FIG. 3, a detailed schematic of an optical voter 12 is shown. For the purpose of this example, a five channel light input is shown, designated 18. For example, input 1 illuminates photoconductors D1–D4. The photoconductors may be, for example, photo diodes, which are capable of being etched on the same silicon die, as the rest of the circuit. Alternatively, the photoconductors may be photo resistors. The majority vote is accomplished by the series/parallel interconnection of the photo diode array. In the five channel illustrated, illumination of any three out of five inputs results in conduction from input 32 to output 16. Any less than three illuminated does not provide conduction. It is understood that the diodes are made to withstand the voltage input at 32. Photodiodes D5–D20 are illuminated by inputs 2–5.

Figure 4:
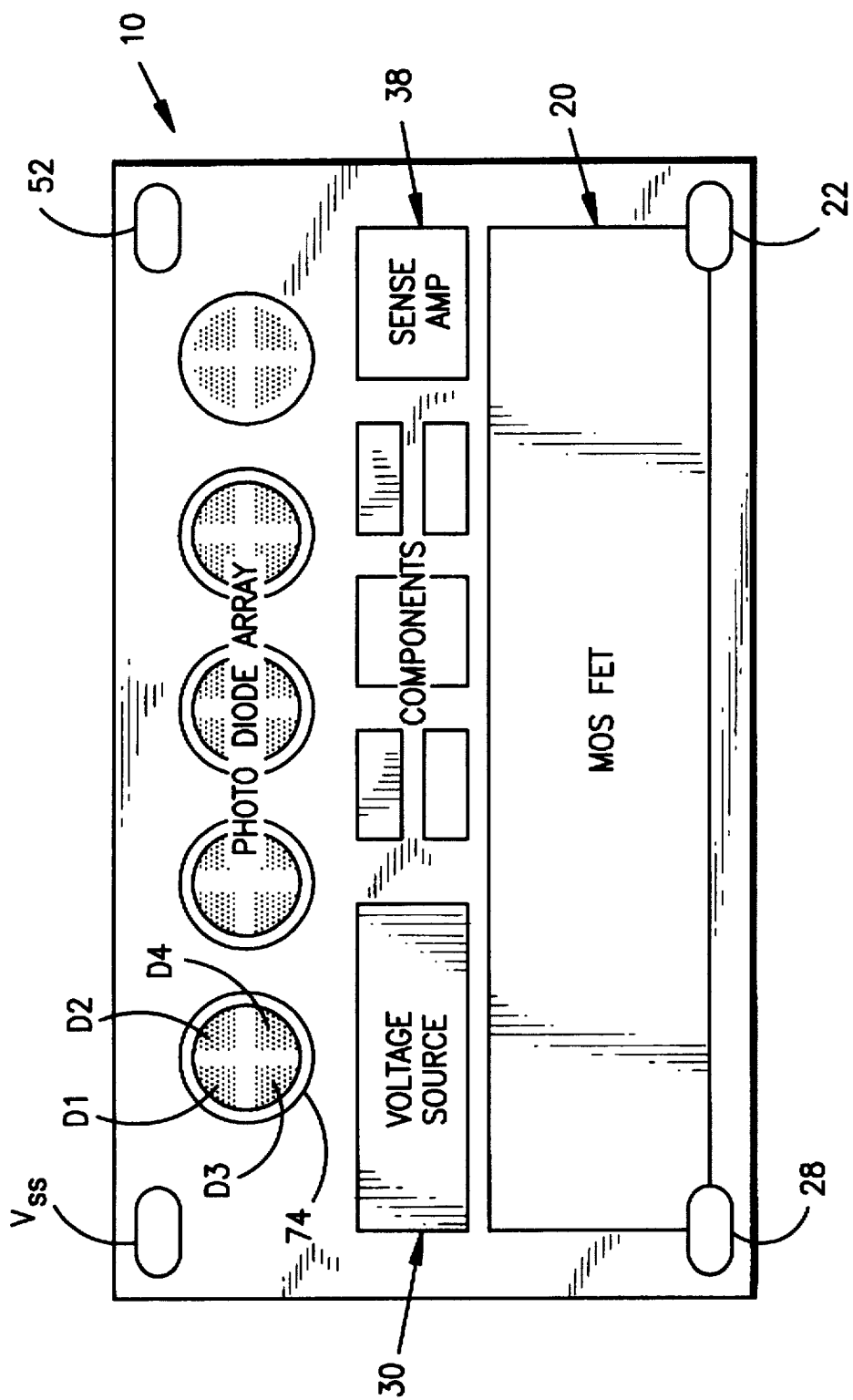
FIG. 4 is a layout diagram of the majority voted optical switch etched on a single silicon die.

All the components of the majority voted optical power switch 10 may be etched on a single silicon die using conventional technologies. FIG. 4 is an example of a switch 10 implemented on a single die 10. The inputs and outputs of the FIG. 1 embodiment correspond to four pads Vss, 52, 22 and 28. The other components are also similarly indicated in FIG. 4. The portion of FIG. 4 labeled "COMPONENTS" refers to resistors, diodes, transistors, that are required for proper operation, some of which are shown in FIG. 1.

Figure 5:
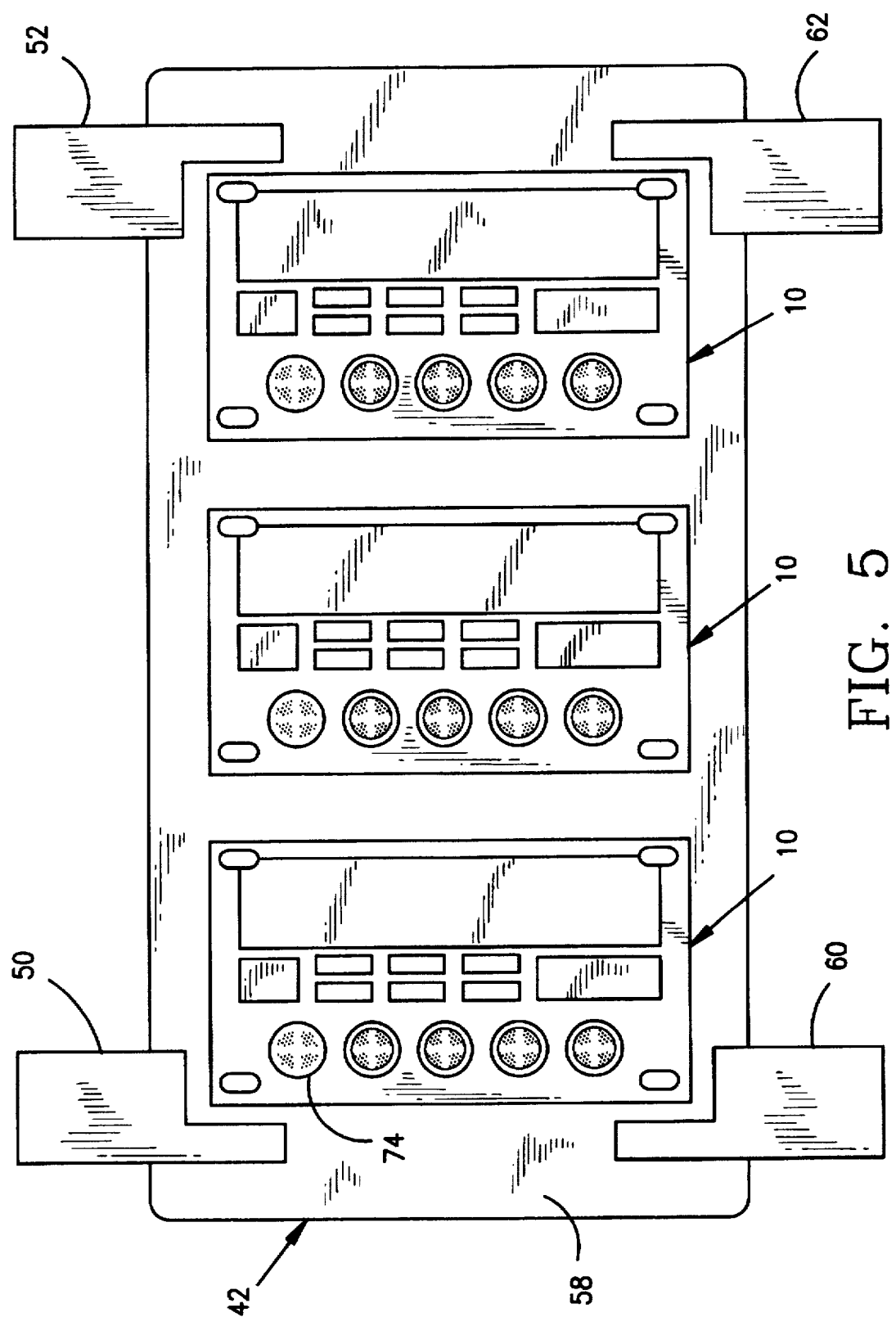
FIG. 5 is an assembly diagram showing a plurality of die mounted to form a switch string subassembly packaged as a surface mount device.

Referring now to FIG. 5, a manufactured switch string subassembly 42 is illustrated. The switch string subassembly 42 includes majority voted optical power switch dies 10 mounted on a single chip carrier 58, a surface mount technology device. Chip leads 50, 52, 60 and 62 correspond to the same designations in FIG. 2.

Figure 6:
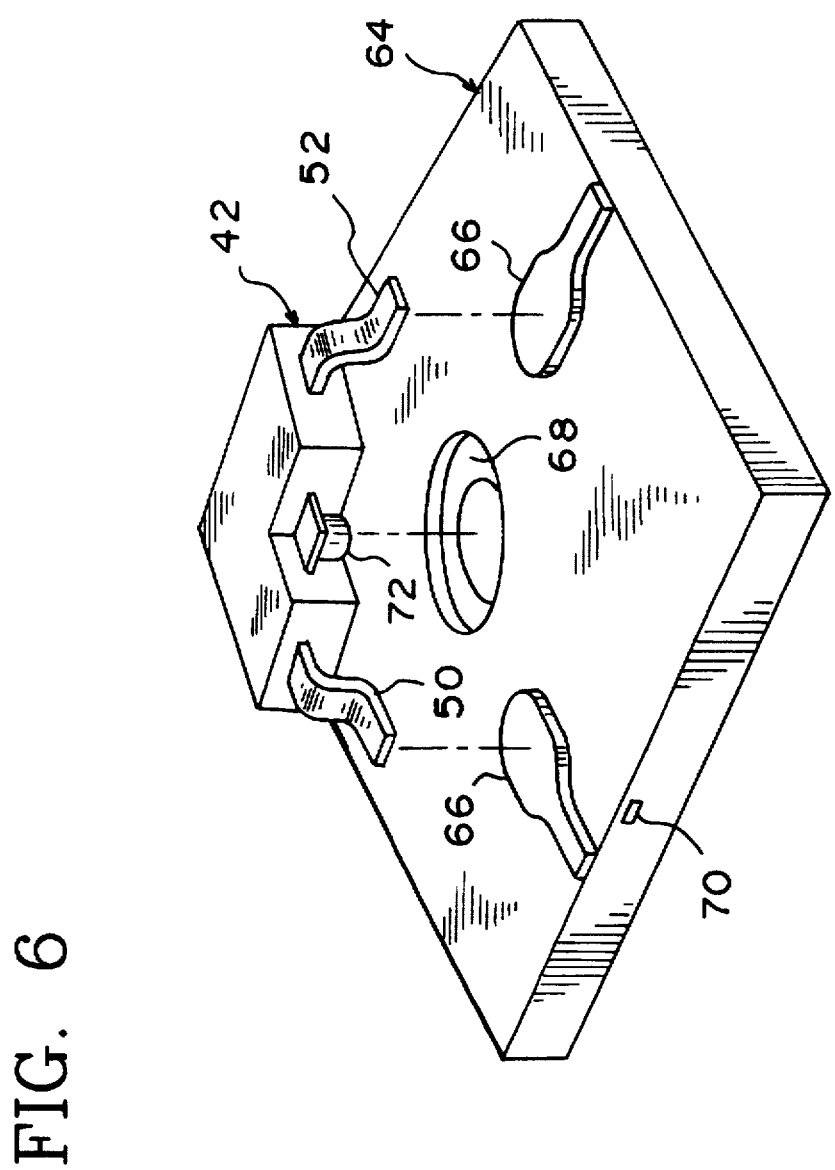
FIG. 6 is a perspective view showing the mounting of a surface mount device of FIG. 5, mounted on an opto-clad printed circuit board.

Referring now to FIG. 6, a perspective view showing the mounting of the surface mount technology device 42 of FIG. 5 on an printed circuit board 64 having embedded optical pathways, is shown. Copper pads 66 accept chip leads, for example, leads 50 and 52. This provides a soldered electrical connection and physical mounting. The circuit board 64 includes optical ports 68, which provide transmission of the optical input commands 18 (see FIG. 1) from channels 70 to optical windows 72 in the subassembly 42. Window 72 is a window to one of the optical inputs 74 (see FIG. 4). Although one window 72 and port 68 are shown in FIG. 6, it is understood that there are fifteen pairs of windows and ports, each corresponding to an optical input on one of the chips 10.

Figure 7:
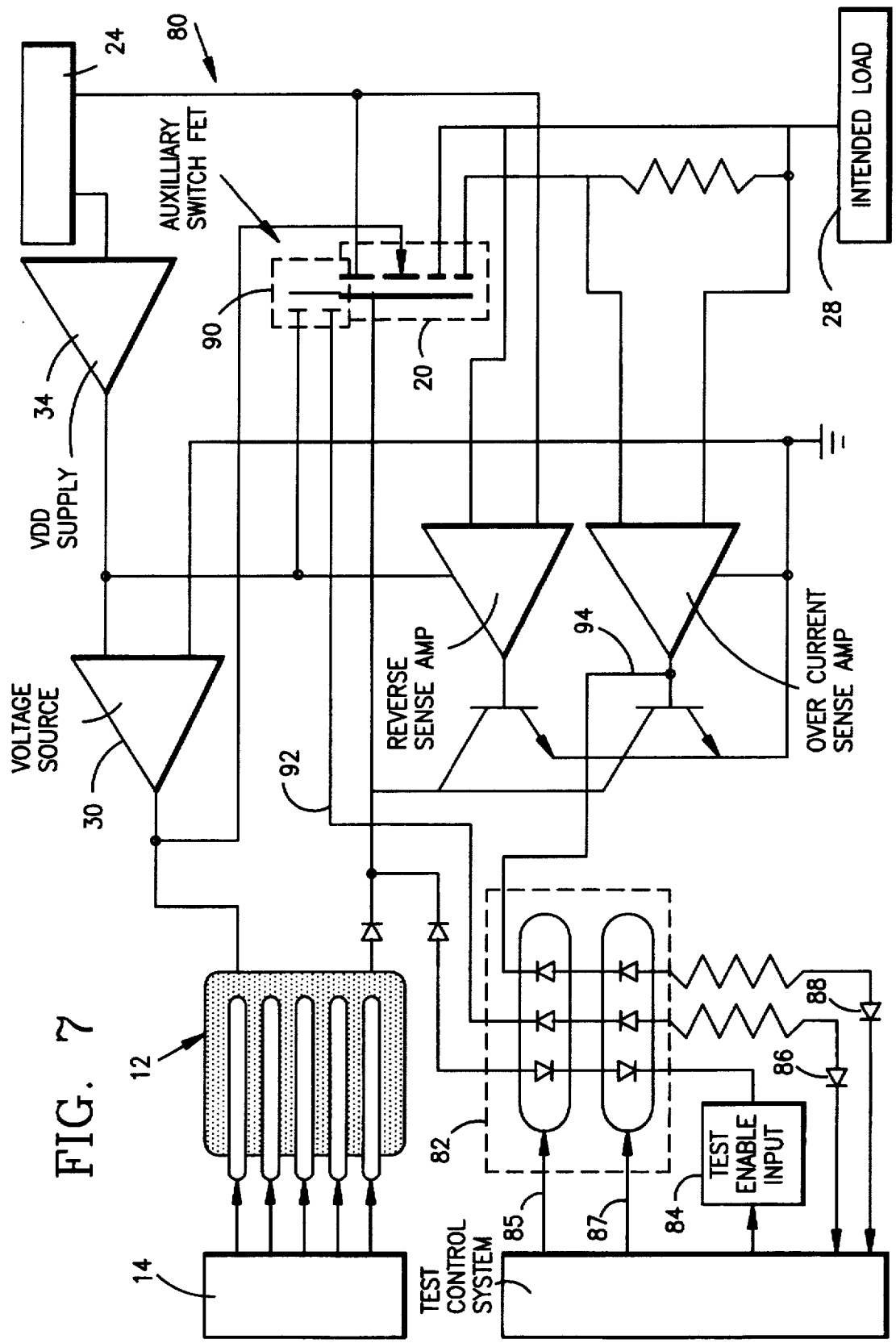
FIG. 7 is a schematic block diagram of a majority voted optical power switch with checkout and test capability.

Referring now to FIG. 7, a schematic block diagram of an alternate majority voted optical power switch with checkout and test capability is illustrated, designated generally as 80. Majority voted optical power switch 80 includes test selection photoconductors 82, which allow the selection of a single switch for testing within an assembly. A test enable input 84 provides the application of voltage to enable testing and obviate inadvertent testing. A switch state LED 86 and overload LED 88 optically communicate the switch status response to the test control system. A test control system 83 provides the test enable input 84 and optical test command inputs 85, 87. Test control system 83 receives the optical outputs of switch status from LED 86 for switch state and LED 88 for switch overload.

Certain circuit modifications provide test activation and status response. An auxiliary MOSFET 90 co-located with MOSFET 20 conducts switch status to the switch status LED 86 through pathway 92. Overload status at the output of the over current sense amp is conducted through line 94 to the overload LED 88.

Obviously, many modifications and variations of the present invention are possible in light of the above teachings. It is therefore to be understood that, within the scope of the appended claims, the invention may be practiced otherwise than as specifically described. What is claimed and desired to be secured by Letters Patent of the United States is:

I claim:

1. A majority voted optical power switch for delivering power from a power source to an intended load, comprising:
    a) an optical voter comprising:
        a photoconductor array for receiving optical voter input commands from a control system and for selecting a voter output from the majority of said input commands;
    b) power switching means for receiving power input from a power source, said power switching means being controlled by said voter output, an output from said power switching means being connected to an intended load;
    c) a voltage source for supplying a voltage to said optical voter; and
    d) an operational amplifier circuit connected to said power switching means to limit overcurrent and inhibit reverse current in said power switching means.

2. The majority voted optical power switch of claim 1, wherein said optical voter comprises an odd number of channels, each channel providing a respective optical path with a plurality of photoconductors in said respective optical path, said photoconductors being so arranged as to provide electrical conduction through said optical voter when a majority combination of said channels is eliminated by blocking its respective optical path.

3. The majority voted optical power switch of claim 2, wherein said photoconductors comprise photo diodes.

4. The majority voted optical power switch of claim 2, wherein said odd number of channels comprises 5 channels, thereby providing two-fault tolerance of input commands.

5. The majority voted optical power switch of claim 1, further including testing means for receiving optical test command inputs and an enabling voltage from a control system, and providing optical outputs of status of said power switching means.

6. The majority voted optical power switch of claim 1, wherein all of the components thereof are formed on a single die.

7. A switch string sub-assembly for delivering power from a power source to an intended load, comprising:
    a plurality of serially connected majority voted optical power switches, each power switch, comprising:
        a) an optical voter, comprising:
            a photoconductor array for receiving optical voter input commands from a control system and for selecting a voter output from the majority of said input commands;
        b) power switching means for receiving power input from either a power source, from an output of another of said plurality of majority voted optical power switches, or from a load return, said power switching means being controlled by said voter output, an output from said power switching means being connected either to an intended load, the power input of another of said plurality of majority voted optical power switches or a common power return;
        c) a voltage source for supplying a voltage to said optical voter; and
        d) an operational amplifier circuit connected to said power switching means to limit overcurrent and inhibit reverse current in said power switching means.

8. A multiple fault tolerant power voter assembly for delivering power from a plurality of power sources to an intended load, comprising:
    a plurality of power sources;
    a load return;
    a common power return; and
    a plurality of switch string subassemblies, each switch string subassembly comprising:
        a plurality of serially connected majority voted optical power switches, each power switch comprising:
            a) an optical voter, comprising:
                photoconductor array for receiving optical voter input commands from a control system and for selecting a voter output from the majority of said input commands;
            b) power switching means for receiving power input from either one of said plurality of power sources, from an output of another of said plurality of majority voted optical power switches, or from said load return, said power switching means being controlled by said voter output, an output from said power switching means being connected either to said intended load, the power input of another of said plurality of majority voted optical power switches, or said common power return;
            c) a voltage source for supplying a voltage to said optical voter; and
            d) an operational amplifier circuit connected to said power switching means to limit overcurrent and inhibit reverse current in said power switching means.

* * * * *